United States Patent
Amano et al.

(10) Patent No.: US 8,973,255 B2
(45) Date of Patent: Mar. 10, 2015

(54) CIRCUIT-SUBSTRATE-RELATED-OPERATION PERFORMING APPARATUS

(75) Inventors: Masafumi Amano, Okazaki (JP);
Kazumi Hoshikawa, Toyohashi (JP);
Mikio Nakajima, Toyokawa (JP);
Hiroyuki Ao, Okazaki (JP); Yusuke Yamakage, Anjo (JP)

(73) Assignee: Fuji Machine Mfg. Co., Ltd., Chiryu-shi (JP)

( * ) Notice: Subject to any disclaimer, the term of this patent is extended or adjusted under 35 U.S.C. 154(b) by 560 days.

(21) Appl. No.: 13/290,322

(22) Filed: Nov. 7, 2011

(65) Prior Publication Data

US 2012/0151756 A1    Jun. 21, 2012

(30) Foreign Application Priority Data

Dec. 17, 2010  (JP) ................. 2010-281220

(51) Int. Cl.
H05K 13/04    (2006.01)
(52) U.S. Cl.
CPC .................. H05K 13/0413 (2013.01)
USPC ......................................... 29/739
(58) Field of Classification Search
CPC .......... H05K 13/0404; H05K 13/0408; H05K 13/0413
USPC .......................... 29/739–741, 743
See application file for complete search history.

(56) References Cited

U.S. PATENT DOCUMENTS 4,831,721 A * 5/1989 Hirai et al. .................. 29/740
5,255,429 A   10/1993 Nishi et al.
2006/0085973 A1 * 4/2006 Kodama et al. ............. 29/740
2011/0030201 A1 * 2/2011 Inaba et al. ................. 29/729
2011/0098840 A1   4/2011 Inaba et al.

FOREIGN PATENT DOCUMENTS

| JP | A-04-311097 | 11/1992 |
| JP | A-2005-235942 | 9/2005 |
| JP | A-2006-261325 | 9/2006 |
| JP | A-2010-16028 | 1/2010 |
| WO | WO 2009125550 A1 * | 10/2009 |

OTHER PUBLICATIONS

May 27, 2014 Office Action issued in Japanese Patent Application No. 2010-281220 (with English translation).

* cited by examiner

Primary Examiner — Livius R Cazan
(74) Attorney, Agent, or Firm — Oliff PLC

(57) ABSTRACT

A circuit-substrate-related-operation performing apparatus for performing a circuit-substrate-related operation which is an operation on a circuit substrate, including: a plurality of heads including at least one work head and at least one detection head; a head holding device configured to hold, at a holding portion thereof, one of the plurality of heads; a moving device configured to move the head holding device; a head stock device in which the plurality of heads are stocked; and a controller configured to control the circuit-substrate-related-operation performing apparatus, wherein the controller includes a head attachment control portion configured to control the moving device and the head holding device such that the head holding device is moved to a set position which is set with respect to the head stock device and such that an arbitrary one of the plurality of heads is held by the head holding device.

10 Claims, 13 Drawing Sheets

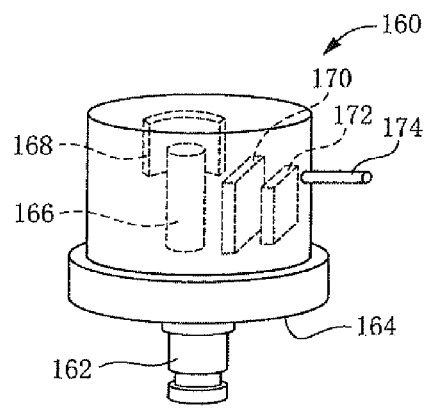
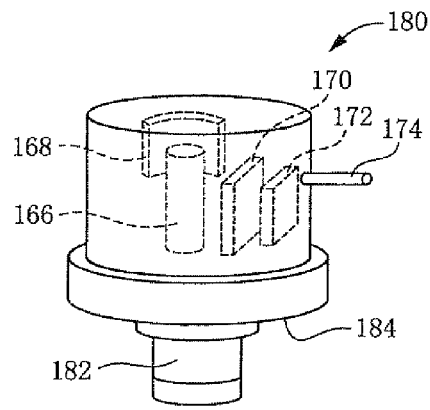
FIG.7A　　　　　　　FIG.7B
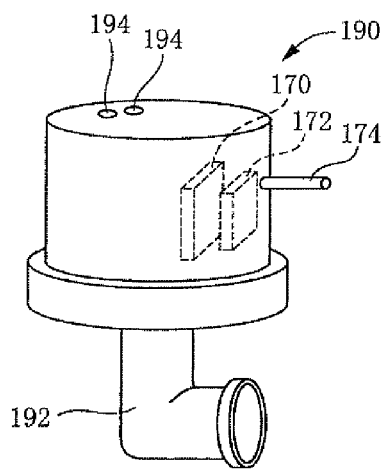
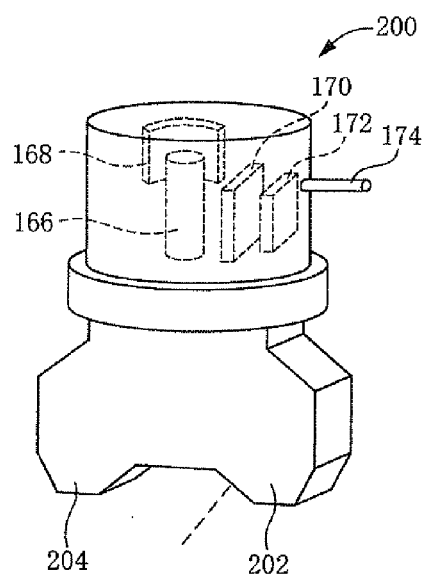
FIG.7C　　　　　　　FIG.7D

FIG.11

FLOW OF OPERATION BY COMPONENT MOUNTING APPARATUS 10

| STEP No. | OPERATION DETAILS | EXCHANGE OF HEADS H |
|---|---|---|
| S1 | CONVEYANCE AND FIXATION OF SUBSTRATE B | |
| | | NARROW-FIELD-OF-VIEW IMAGE TAKING HEAD 160 |
| S2 | IMAGE TAKING OF EACH SUBSTRATE FIDUCIAL MARK | ↓ |
| | | WIDE-FIELD-OF-VIEW IMAGE TAKING HEAD 180 |
| S3 | IMAGE TAKING OF MOUNTING PORTION OF EACH LARGE-SIZE COMPONENT P1 | ↓ |
| | | DISPENSER HEAD 154 |
| S4 | APPLICATION OF ADHESIVE TO SURFACE OF SUBSTRATE B | ↓ |
| | | SINGLE-TYPE NOZZLE HEAD 150 |
| S5 | MOUNTING OF LARGE-SIZE COMPONENTS P1 | ↓ |
| | | HEIGHT DETECTION HEAD 200 |
| S6 | MEASUREMENT OF HEIGHT POSITION OF UPPER SURFACE OF EACH LARGE-SIZE COMPONENT P1 | ↓ |
| | | DISPENSER HEAD 154 |
| S7 | APPLICATION OF ADHESIVE TO UPPER SURFACE OF EACH LARGE-SIZE COMPONENT P1 | ↓ |
| | | INDEX-TYPE NOZZLE HEAD 60 |
| S8 | MOUNTING OF SMALL-SIZE COMPONENTS P2 | ↓ |
| S9 | MOUNTING OF STACK COMPONENTS P3 | ↓ |
| | | WIDE-FIELD-OF-VIEW IMAGE TAKING HEAD 180 |
| S10 | INSPECTION OF MOUNTING POSITION OF EACH COMPONENT | ↓ |
| | | NO HEADS ARE HELD |
| S11 | FREEING SUBSTRATE B FROM FIXATION AND CONVEYANCE OF SUBSTRATE B OUT OF APPARATUS | |

# CIRCUIT-SUBSTRATE-RELATED-OPERATION PERFORMING APPARATUS

CROSS REFERENCE TO RELATED APPLICATION

The present application claims priority from Japanese Patent Application No. 2010-281220, which was filed on Dec. 17, 2010, the disclosure of which is herein incorporated by reference in its entirety.

BACKGROUND OF THE INVENTION

1. Field of the Invention

The present invention relates to a circuit-substrate-related-operation performing apparatus configured to perform an operation on a circuit substrate.

2. Discussion of Related Art

As one kind of a circuit-substrate-related-operation performing apparatus configured to perform an operation on a circuit substrate, there is known a circuit-substrate-related-operation performing apparatus as disclosed in the following Patent Literature, namely, a component mounting apparatus configured to mount components such as electronic components on the circuit substrate. The component mounting apparatus is configured such that a component holding head as one kind of a work head is automatically exchangeable. More specifically, a head holding device, which holds the component holding head at a holding portion thereof, is configured to exchangeably hold an arbitrary one of a plurality of component holding heads. The head holding device is configured to be moved on a work area by a moving device.

Patent Literature 1: JP-A-2006-261325

SUMMARY OF THE INVENTION

The component mounting apparatus described in the above Patent Literature has an image taking device (mark camera) which takes an image of a fiducial mark provided on a surface of the circuit substrate, for specifying or identifying a position of the circuit substrate prior to mounting of components onto the circuit substrate. The image taking device is fixed to the head holding device which holds the component holding head. The image taking device is one kind of a detection device. In the component mounting apparatus described in the above Patent Literature, only one detection device is moved on the work area, together with the head holding device. There is plenty of room for improvement in such a circuit-substrate-related-operation performing apparatus, and it is possible to enhance utility by making various modifications. The present invention has been made in view of such situations, and it is an object of the invention to provide a circuit-substrate-related-operation performing apparatus with high utility.

SUMMARY OF THE INVENTION

To attain the object indicated above, the circuit-substrate-related-operation performing apparatus according to the present invention is configured such that an arbitrary one of a plurality of heads, which include at least one work head and at least one detection head, is attached to a head holding device, by controlling the head holding device and a moving device for moving the head holding device.

Advantageous Effects of Invention

In the circuit-substrate-related-operation performing apparatus according to the present invention, not only the at least one work head, but also the at least one detection head is attachable to the head holding device at the same position as the at least one work head. In other words, the circuit-substrate-related-operation performing apparatus according to the present invention is configured such that the at least one detection head is automatically exchangeable with the at least one work head. Accordingly, the thus configured circuit-substrate-related-operation performing apparatus has high utility. The details of the advantageous effects will be explained in the following FORMS OF INVENTION.

FORMS OF INVENTION

There will be explained various forms of an invention which is considered claimable (hereinafter referred to as "claimable invention" where appropriate). Each of the forms of the invention is numbered like the appended claims and depends from the other form or forms, where appropriate. This is for easier understanding of the claimable invention, and it is to be understood that combinations of constituent elements that constitute the invention are not limited to those described in the following forms. That is, it is to be understood that the claimable invention shall be construed in the light of the following descriptions of various forms and embodiments. It is to be further understood that any form in which one or more elements is/are added to or deleted from any one of the following forms may be considered as one form of the claimable invention.

(1) A circuit-substrate-related-operation performing apparatus for performing a circuit-substrate-related operation which is an operation on a circuit substrate, comprising:

a plurality of heads including at least one work head and at least one detection head;

a head holding device configured to hold, at a holding portion thereof, one of the plurality of heads;

a moving device configured to move the head holding device;

a head stock device in which the plurality of heads are stocked; and a controller configured to control the circuit-substrate-related-operation performing apparatus, wherein the controller includes a head attachment control portion configured to control the moving device and the head holding device such that the head holding device is moved to a set position which is set with respect to the head stock device and such that an arbitrary one of the plurality of heads is held by the head holding device.

In the circuit-substrate-related-operation performing apparatus according to this form, not only the work head, but also the detection head is attachable to the head holding device at the same position as the work head. That is, the head holding device is configured to selectively hold, at a holding portion thereof, one of the plurality of heads that include the work head and the detection head. In short, the detection head is automatically exchangeable with the work head. Accordingly, the circuit-substrate-related-operation performing apparatus in this form has high utility.

More specifically, by employing an image taking head as the detection head, the image taking head is used in place of an image taking device which was conventionally disposed on the head holding device for taking an image of a substrate fiducial mark or the like. Conventionally, the image taking device is fixed to the head holding device at a position different from a position of the work head. In other words, the image taking device is disposed at a position which is shifted from a position at which the work head performs an operation, in a movement direction by the moving device. Accordingly, where the image taking device is moved in the same area as the work area of the work head, it is necessary to enlarge a movable range of the head holding device by an additional amount corresponding to a shifted amount described above. In the present apparatus, in contrast, the image taking head is held by the head holding device at the same position as the position of the work head, by exchanging the work head with the image taking head. Accordingly, it is not necessary to additionally enlarge the movable range of the head holding device, attaining the circuit-substrate-related-operation performing apparatus which is compact in structure. Conversely, in spite of the compact circuit-substrate-related-operation performing apparatus, the apparatus permits the image taking head to perform an image taking operation at any position at which the operation by the work head is to be performed or has been performed, as long as the position is located within the work area. In other words, by moving the head holding device so as to be located at the same position as a position at which the operation by the work head is to be performed or the operation by the work head has been actually performed, the image taking operation by the image taking head can be performed at the position.

As explained later, where a plurality of detection heads are prepared and the work head and the detection heads are exchangeable with one another, various sorts of detection operations can be performed by the circuit-substrate-related-operation performing apparatus, enhancing versatility of the apparatus. The advantages of enhancement of versatility and downsizing of the apparatus described above are sufficiently offered not by manual exchange of the heads by a worker, but by an arrangement in which the circuit-substrate-related-operation performing apparatus is configured to automatically exchange the heads, leading to enhanced utility.

The "work head" in this form means a head for executing a main operation performed by the present circuit-substrate-related-operation performing apparatus. Where the present circuit-substrate-related-operation performing apparatus is a component mounting apparatus configured to mount, on the circuit substrate, components such as electronic components and circuit components or where the present circuit-substrate-related-operation performing apparatus functions as the component mounting apparatus, the work head is constituted by a component holding head for holding the components. Where the present circuit-substrate-related-operation performing apparatus is an adhesive applicator configured to apply an adhesive to the circuit substrate or the like or where the present circuit-substrate-related-operation performing apparatus functions as the adhesive applicator, the work head is constituted by an adhesive ejecting head for ejecting the adhesive.

The "detection head" in this form may be regarded as a head for detecting the circuit substrate or a position, a posture, etc., of a component mounted on the circuit substrate, prior to or in association with the above-described main operation. Concretely, the detection head is an image taking head equipped with a camera for taking an image of a substrate fiducial mark provided on the surface of the circuit substrate, an image of a portion of the circuit substrate onto which the component is to be mounted, an image of the component mounted on the circuit substrate, etc., or a sensing head equipped with a displacement sensor for detecting a specific portion of the circuit substrate, the position and the posture of the component, etc.

The "head stock device" in this form may be regarded as a device, the so-called stocker, for accommodating the heads in the movable range of the head holding device so as to be pickable by the head holding device. For instance, the head stock device may be a simple stocker in which the plurality of heads are disposed at respective positions set for the respective heads. Alternatively, the head stock device may have a function of moving the plurality of heads accommodated therein, such that one of the heads moved to a prescribed exchange position is holdable by the head holding device.

The "moving device" in this form is a device configured to move the head holding device within a range of the present circuit-substrate-related-operation performing apparatus in a one-dimensional, second-dimensional, or third-dimensional fashion, for instance. Concretely, the moving device may be an X-Y type moving device, a multiarticular-arm robot-type moving device, or the like.

A mechanism for holding the head in the "head holding device" in this form is not particularly limited. There may be employed various mechanisms such as a mechanism of holding the head by negative-pressure suction, a mechanism of holding the head utilizing an electromagnetic force or a biasing force owing to a pneumatic pressure, a hydraulic pressure or the like, a mechanism of grasping the head utilizing a chuck, a clamp or the like. The "head holding device" may be equipped with a moving mechanism of moving the head held by itself or a rotating mechanism of rotating the head held by itself, as explained later.

(2) The circuit-substrate-related-operation performing apparatus according to the form (1), wherein the at least one work head includes a component holding head for holding a component to be mounted on the circuit substrate.

In short, the circuit-substrate-related-operation performing apparatus according to this form is a component mounting apparatus or an operation performing apparatus functioning as the component mounting apparatus. In short, the "component holding head" according to this form is a head having a function of holding a component such as an electronic component, a circuit component or the like and releasing the component held by itself on the substrate. The mechanism of holding the component is not particularly limited. For instance, there may be employed heads having various holding mechanisms, such as a nozzle head having a suction nozzle for sucking a component by a negative pressure and a clamp head having a clamp (which may be also referred to as a "chuck") for grasping a component. The component holding head may have one or a plurality of component holding members such as the suction nozzle and the clamp. In other words, the component holding head may be configured to hold only one component or to hold a plurality of components at the same time.

(3) The circuit-substrate-related-operation performing apparatus according to the form (1) or (2), wherein the at least one detection head includes at least one image taking head each of which has a camera as one principal constituent element.

According to this form, the at least one image taking head is attachable to the head holding device, and it is possible to take images of various objects such as the substrate fiducial mark, a portion of the substrate onto which the component is to be mounted, a portion of the substrate to which the adhesive is to be applied, and the component mounted on the substrate. Accordingly, this form contributes to an improvement in the accuracy in the substrate-related operation.

(4) The circuit-substrate-related-operation performing apparatus according to the form (3), wherein the at least one detection head includes, as the at least one image taking head, a plurality of image taking heads.

According to this form, a plurality of image taking heads can be selectively attached, enhancing versatility of the circuit-substrate-related-operation performing apparatus.

(5) The circuit-substrate-related-operation performing apparatus according to the form (4), wherein the cameras of the respective image taking heads are mutually different in any of resolution, field of view, and image taking direction.

Where the camera is a digital camera having an image taking element such as CCD, CMOS, etc., for instance, the resolution depends on a number of picture elements (which may be hereinafter referred to as "pixel density" where appropriate) used for taking an image of a unit area of the object whose image is to be taken by the camera. That is, the higher the pixel density, the higher the resolution. On the other hand, where the pixel density is high, it takes a longer time for image processing. Accordingly, by using a plurality of image taking heads having respective cameras which are mutually different in resolution, the image taking operation using a camera with high resolution is performed on only an object for which a high degree of detection accuracy is required while the image taking operation using a camera with low resolution is performed on an object for which a high degree of detection accuracy is not required, thereby ensuring prompt detection processing. Further, a camera with a wide field of view is used to take an image of a large-size component or a portion of the substrate onto which the large-size component is to be mounted while a camera with a narrow field of view is used to take an image of a small-size component, a portion of the substrate onto which the small-size component is to be mounted, or the substrate fiducial mark, whereby it is possible to perform detection processing in a minimum time. Moreover, when an image of the surface of the substrate, an image of the substrate fiducial mark or the like is taken, it is convenient to use a camera whose image taking direction is perpendicular to the surface of the substrate. When the height of the component or the like mounted on the substrate is detected, it is convenient to use a camera whose image taking direction is inclined with respect to a direction perpendicular to the surface of the substrate. In the circuit-substrate-related-operation performing apparatus according to this form, it is possible to selectively employ a plurality of image taking heads having the respective cameras which axe mutually different in any of resolution, field of view, and image taking direction, enabling detection processing to suitably cope with variations of the object whose image is to be taken.

(6) The circuit-substrate-related-operation performing apparatus according to the form (4) or (5), wherein the plurality of image taking heads have respective light sources which are mutually different in wavelength distribution of light to be emitted.

In a case where the lights emitted from the respective light sources have mutually different wavelength distributions (frequency distributions), in short, the colors of the lights emitted from the respective light sources are mutually different. Where the colors of the lights emitted from the respective light sources are made different from each other depending upon the color, the gloss, the transparency or the like of the object whose image is to be taken, it is possible to conduct detection, with high accuracy, with respect to various sorts of objects whose images are to be taken. In the circuit-substrate-related-operation performing apparatus according to this form, therefore, it is possible to selectively employ the plurality of image taking heads having the respective cameras which are mutually different in the color of the lights emitted from the respective light sources, enabling detection processing to suitably cope with variations of the object whose image is to be taken.

(7) The circuit-substrate-related-operation performing apparatus according to any one of the forms (3)-(6), further comprising a fiducial mark which is provided for one of the at least one image taking head at a position which is within a field of view of the camera of the one of the at least one image taking head, in a state in which the one of the at least one image taking head is stocked in the head stock device, the fiducial mark being for obtaining a position shift of an optical axis of the camera relative to the head holding device.

For instance, when one image taking head is replaced with another image taking head, namely, when another image taking head is held by the head holding device, there is generated a certain degree of shift in the holding position. The shift causes a shift in the optical axis of the camera. The apparatus in this form enables detection accuracy to be improved by grasping the shift in the optical axis. In the circuit-substrate-related-operation performing apparatus according to this form, the image taking head is accommodated in the head stock device so as to be disposed at a position at which an image of the fiducial mark can be taken. Therefore, the image of the fiducial mark can be taken at a time point when the image taking head is held by the head holding device, so that the shift in the optical axis can be promptly grasped.

(8) The circuit-substrate-related-operation performing apparatus according to any one of the forms (1)-(7), wherein the at least one detection head comprises a detection head which has a transmitter capable of transmitting detection data obtained by the detection head.

In the circuit-substrate-related-operation performing apparatus according to this form, the detection head per se is capable of transmitting detected data. Accordingly, where the detected data is arranged to be transmitted according to a prescribed protocol, for instance, it is possible to simplify a structure of a device which receives the detected data. Where the transmitter allows wireless transmission, no connectors are required between the detection head and the head holding device, simplifying the structure of the circuit-substrate-related-operation performing apparatus.

(9) The circuit-substrate-related-operation performing apparatus according to any one of the forms (1)-(8), wherein the at least one detection head comprises a detection head configured to receive, from the head holding device, an electric power by which the detection head is operated, in a state in which the detection head is held by the head holding device.

In the circuit-substrate-related-operation performing apparatus according to this form, the electric power can be supplied to the detection head from a time point when the detection head is held by the head holding device. A connector may be disposed between the detection head and the head holding device, and the electric power may be supplied to the detection head through the connector. However, where the detection head is configured such that the electric power can be supplied thereto in a noncontact fashion, the connector is not required, simplifying the structure of the circuit-substrate-related-operation performing apparatus.

(10) The circuit-substrate-related-operation performing apparatus according to any one of claims (1)-(8), wherein the at least one detection head comprises a detection head having a battery by which the detection head is operated, and the battery is charged in a state in which the detection head is stocked by the head stock device.

In the circuit-substrate-related-operation performing apparatus according to this form, the head holding device is not required to be equipped with a power supply mechanism, whereby the structure of the head holding device can be simplified. The power supply from the head stock device to the battery of the detection head may be wireline supply through a connector. However, the power supply in a noncontact fashion is preferable in terms of simplification of the structure.

(11) The circuit-substrate-related-operation performing apparatus according to any one of the forms (1)-(10), wherein the moving device is configured to move the head holding device in a direction along a straight line parallel to the circuit substrate or to move the head holding device along one flat plane parallel to the circuit substrate.

(12) The circuit-substrate-related-operation performing apparatus according to the form (11), wherein the head holding device includes a head moving mechanism configured to move, in a direction perpendicular to the circuit substrate, the one of the plurality of heads held by the head holding device.

(13) The circuit-substrate-related-operation performing apparatus according to the form (11) or (12), wherein the head holding device includes a head rotating mechanism configured to rotate, about an axis perpendicular to the circuit substrate, the one of the plurality of heads held by the head holding device.

In each of the above-indicated three forms, a limitation relating to a mechanism for moving or rotating the head is added. The circuit-substrate-related-operation performing apparatus equipped with an XY robot-type moving device is included in the form (11). The form (12) may be regarded as a form in which the circuit-substrate-related-operation performing apparatus is equipped with a head moving device for moving the head in a three-dimensional manner.

(14) The circuit-substrate-related-operation performing apparatus according to any one of the forms (1)-(13), further comprising, apart from the at least one detection head, an image taking device which is provided on the head holding device and which is capable of taking an image of a surface of the circuit substrate.

(15) The circuit-substrate-related-operation performing apparatus according to the form (14), wherein the image taking device includes a fixed-focus camera.

The circuit-substrate-related-operation performing apparatus according to each of the above-indicated two forms has, apart from the image taking head, an image taking device fixed to the head holding device. For instance, the circuit-substrate-related-operation performing apparatus according to each of the two forms may include an operation performing apparatus in which the image taking device indicated above is used as a detection device exclusively used for taking an image of the substrate fiducial mark while the detection head is used as a detection device for detecting other objects. The above-indicated two forms contribute to a speedup of the operations performed by the circuit-substrate-related-operation performing apparatus and an enhancement in versatility and diversification of the circuit-substrate-related-operation performing apparatus. In the latter of the two forms, even if the image taking device is not constituted by a zoom camera, there is obtained the same advantages as in an arrangement in which the image taking device with the zoom camera is provided, by permitting the head holding device to hold the image taking head having cameras with different focal lengths.

BRIEF DESCRIPTION OF THE DRAWINGS

The above and other objects, features, advantages and technical and industrial significance of the present invention will be better understood by reading the following detailed description of embodiments of the invention, when considered in connection with the accompanying drawings, in which:

FIGS. 7A-7D are perspective views showing detection heads each of which is holdable by the head holding device;

FIG. 11 is a table showing steps of a component mounting operation performed by the component mounting apparatus and a manner of exchange of heads carried out prior to each step;

DETAILED DESCRIPTION OF THE EMBODIMENTS

There will be hereinafter explained in detail a component mounting apparatus according to one embodiment of the claimable invention with reference to drawings. It is to be understood that the claimable invention may be embodied with various changes and modifications based on the knowledge of those skilled in the art, in addition to the following embodiments and various forms described in the FORMS OF INVENTION.

EMBODIMENTS

<Overall Structure of Component Mounting Apparatus>

Figure 1:
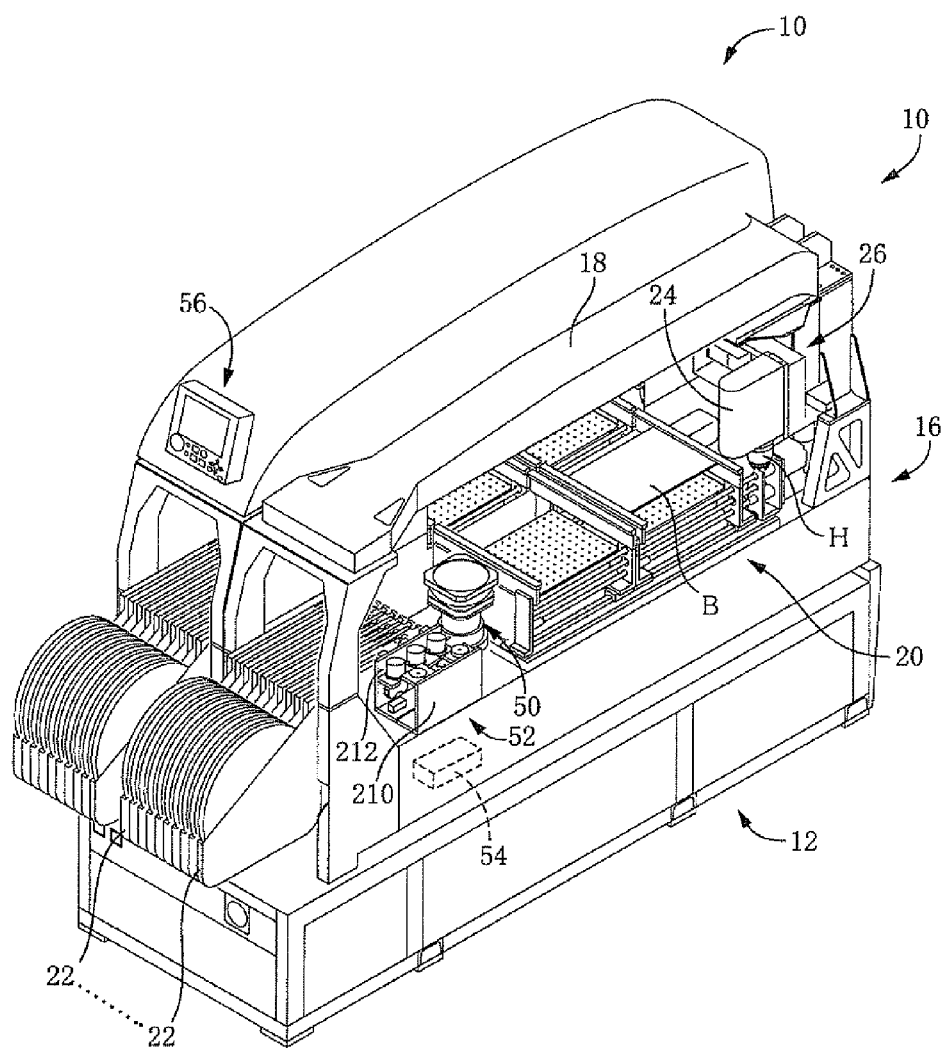
FIG. 1 is a perspective view showing a component mounting apparatus which is a circuit-substrate-related-operation performing apparatus according to one embodiment of the invention.

FIG. 1 shows a system which includes a component mounting apparatus 10 according to one embodiment of the invention. In the system, two component mounting apparatus 10 are juxtaposed on a base 12. The two component mounting apparatus 10 are identical in construction. One of the two component mounting apparatus 10 located on the right side in FIG. 1 is in a state in which a cover is removed. The component mounting apparatus 10 is an operation performing apparatus configured to mount components such as electronic components and circuit components on a circuit substrate B (hereinafter simply referred to as "substrate B" where appropriate). The component mounting apparatus 10 is one kind of a circuit-substrate-related-operation performing apparatus.

The component mounting apparatus 10 includes, as a base body, a base frame 16 and a beam 18 provided above the base frame 16. The component mounting apparatus 10 includes a substrate conveying and fixing device 20 disposed on the base frame 16, a plurality of component suppliers 22, a head holding device 24 for holding a selected one of heads H later explained, and a moving device 26 supported by the beam 18 and configured to move the head holding device 24. The head holding device 24 may be referred to as a head 24, and the head H may be referred to as an attaching unit H or an attaching device H as a designation meaning equipment which is attachable to the head 24.

While an explanation of a detailed structure of the substrate conveying and fixing device 20 is omitted, the substrate conveying and fixing device 20 is constituted by two conveyor devices arranged in a direction perpendicular to a substrate conveyance direction. Each conveyor device includes a pair of belt conveyors as a main constituent element. The two conveyor devices are capable of conveying the substrate B independently of each other. Each conveyor device is configured to convey the substrate B from an upstream-side circuit-substrate-related-operation performing apparatus, to fix the substrate B to a predetermined position within a work area of the component mounting apparatus 10, and to convey the substrate B onto which the components have been mounted, to a downstream-side circuit-substrate-related-operation performing apparatus. Because the present component mounting apparatus 10 has the two conveyor devices, it may be considered that the apparatus 10 has two stages for component mounting. Accordingly, it is possible to perform a mounting operation alternately between the two stages with respect to the substrates B of the same kind. Further, it is possible to perform a mounting operation on the substrates B which are different for different stages.

While an explanation of a detailed structure of the component supplier 22 is omitted, the component supplier 22 is the so-called feeder-type component supplier and is configured to intermittently move a tape on which the components are held and to supply the components at a predetermined position such that the components are pickable. In the present component mounting apparatus 10, in place of or in addition to the feeder-type component supplier 22, the so-called tray-type component supplier may be provided.

The head holding device 24 is for holding a selected one of various sorts of the heads H explained below. In other words, the head holding device 24 is a device to which the selected head H is attached. The head holding device 24 has a mechanism for holding and detaching the head H and a mechanism for elevating and lowering the head H held by the head holding device 24, and a mechanism for rotating the head H held by the head holding device 24. The detailed structure of the head holding device 24 will be explained later. In FIG. 1, the head holding device 24 is in a state in which a cover is attached thereto and in which the head holding device 24 holds, as the head H, an index-type nozzle head which is a component holding head.

Figure 2:
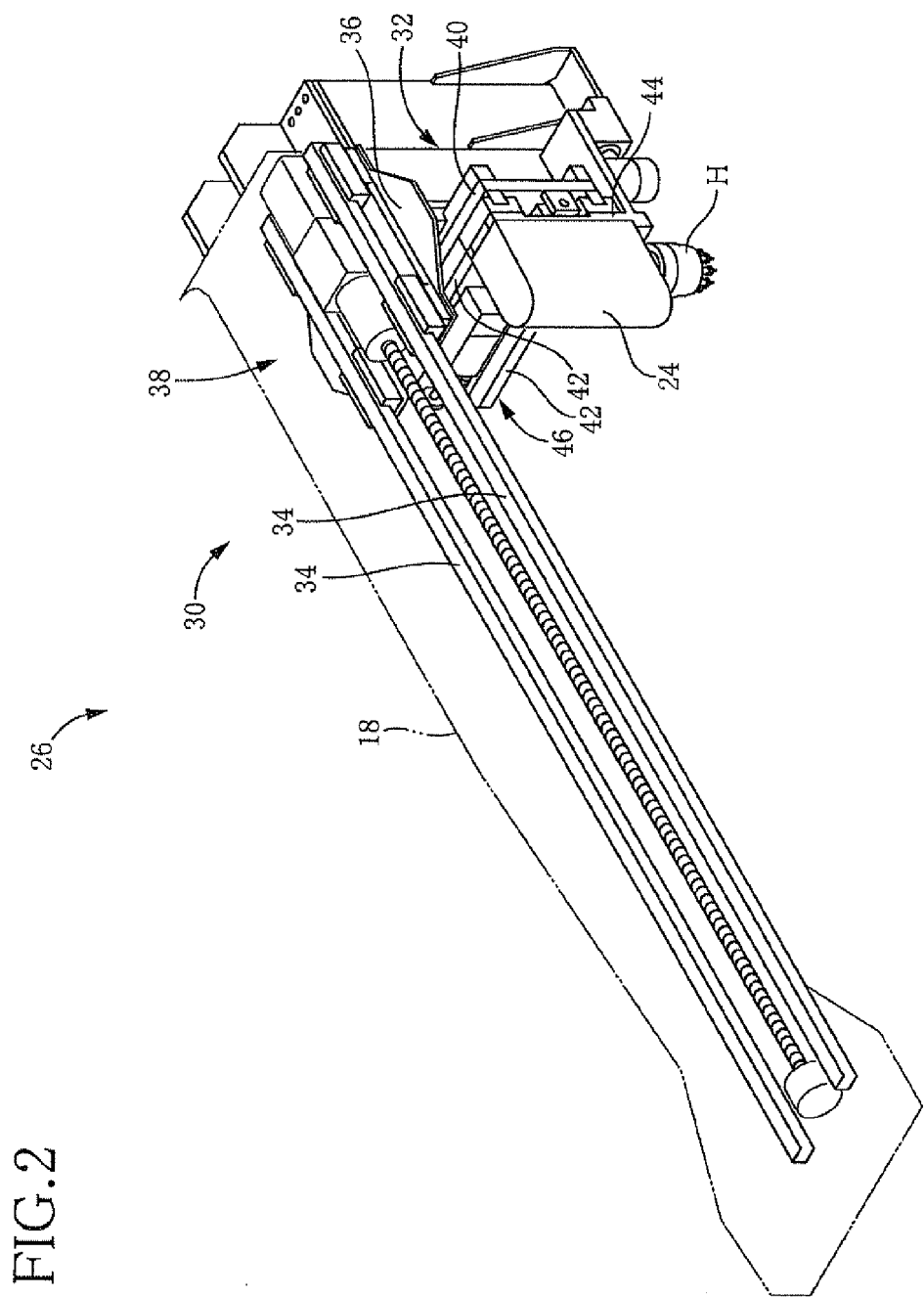
FIG. 2 is a perspective view showing a head holding device and a moving device for moving the head holding device which are included in the component mounting apparatus.

FIG. 2 shows a moving device 26 configured to move the head holding device 24 within the work area. The moving device 26 is an XY-type moving device including: an X-direction moving mechanism 30 configured to move the head holding device 24 in a direction (hereinafter referred to as "X direction" where appropriate) which is perpendicular to the substrate conveyance direction and which is horizontal; and a Y-direction moving mechanism 32 configured to move the head holding device 24 in the substrate conveyance direction (hereinafter referred to as "Y direction" where appropriate).

Figure 3:
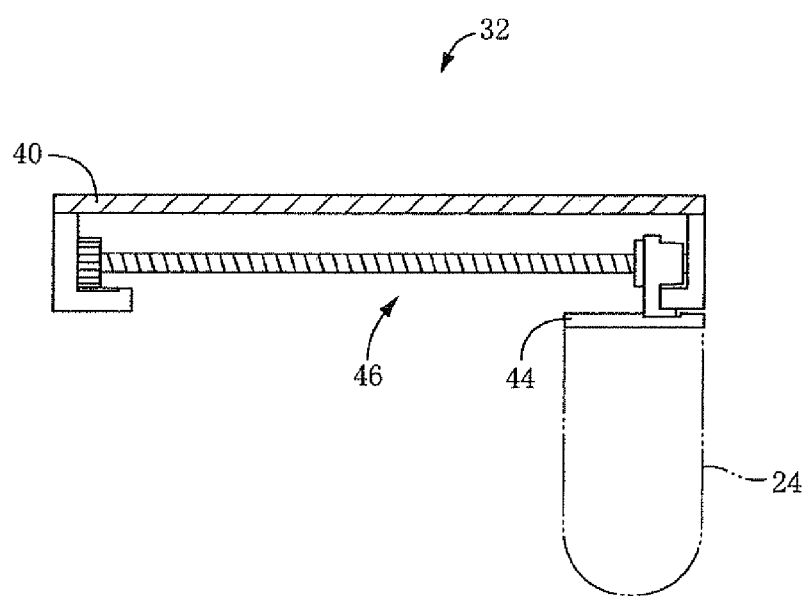
FIG. 3 is a cross-sectional view showing a linear moving mechanism that constitutes the moving device.

The X-direction moving mechanism 30 is a linear-type moving mechanism including: two X guide rails 34 fixed to the beam 18; an X slide 36 which is slidable along the X guide rails 34; and an X drive device 38 which includes an electric motor, a ball screw mechanism and the like and which is configured to drive the X slide 36. As also shown in the cross-sectional view of FIG. 3, the Y-direction moving mechanism 32 is a linear-type moving mechanism including: a support plate 40 fixedly supported by the X slide 36; two Y guide rails 42 supported by the support plate 40; a Y slide 44 which is slidable along the Y guide rails 42; and a Y drive device 46 which includes an electric motor, a ball screw mechanism and the like and which is configured to drive the Y slide 44. The head holding device 24 is fixed to the Y slide 44. In the present component mounting apparatus 10, a moving range of the head holding device 24 in the substrate conveyance direction, namely, in the Y direction, is made comparatively small while a moving range of the head holding device 24 in the X direction is made comparatively large.

As apparent from FIG. 1, the present component mounting apparatus 10 has a component camera 50 which is an image taking device configured to detect a position and a posture of each component held by the component holding head. The component camera 50 is disposed at a position on the base frame 16 between the substrate conveying and fixing device 20 and the component supplier 22. On the base frame 16, there is provided a head stocker 52, as a head stock device, for accommodating the heads H, so as to be located in the neighborhood of the component supplier 22. The head stocker 52 will be later explained. The present component mounting apparatus 10 further includes, in the inside of the base frame 16, a controller 54, as a control device, configured to control the apparatus 10. On the upper cover of the apparatus 10, there is provided an operation panel 56 which is an input/output device with respect to the controller 54.

<Structure of Head Holding Device>

Figure 4:
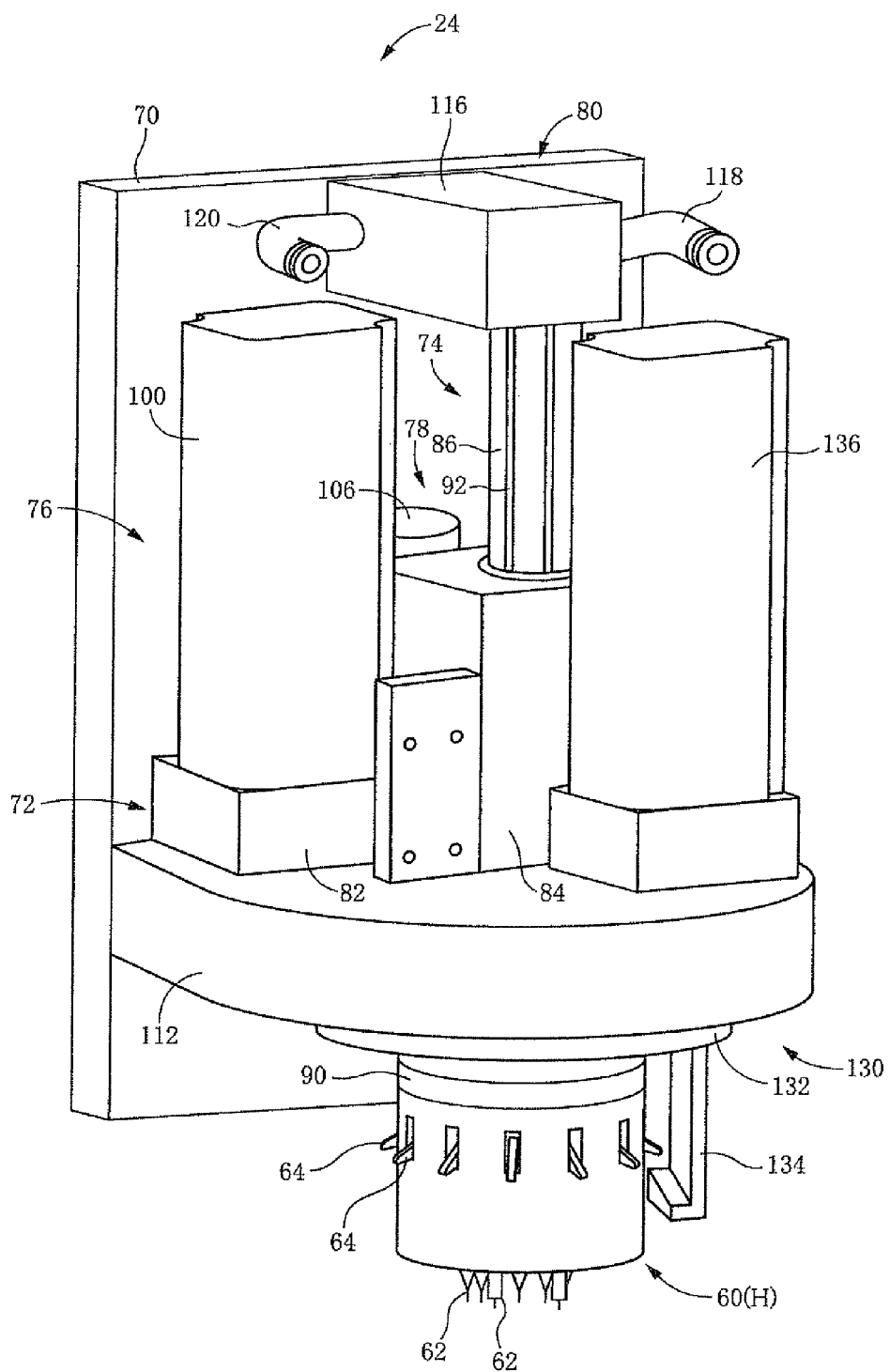
FIG. 4 is a perspective view showing the head holding device in a state in which the head holding device holds an index-type nozzle head as one kind of a component holding head.

FIG. 4 is a perspective view of the head holding device 24. FIG. 4 shows the head holding device 24 in a state in which the cover is removed therefrom and in which the index-type nozzle head 60 that will be explained is attached as the head H. In other words, the head holding device 24 holds the nozzle head 60. The nozzle head 60 includes twelve suction nozzles 62 respectively for suction-hold the components by a negative pressure and twelve levers 64 corresponding to the respective twelve suction nozzles 62. The nozzle head 60 is configured such that the component held by each suction nozzle 62 is mounted on the surface of the substrate B by an action of a corresponding one of the levers 64, as explained below. In the following explanation, where it does not matter which one of the heads is attached to the head holding device 24, the head is referred to as "the head H".

Figure 5:
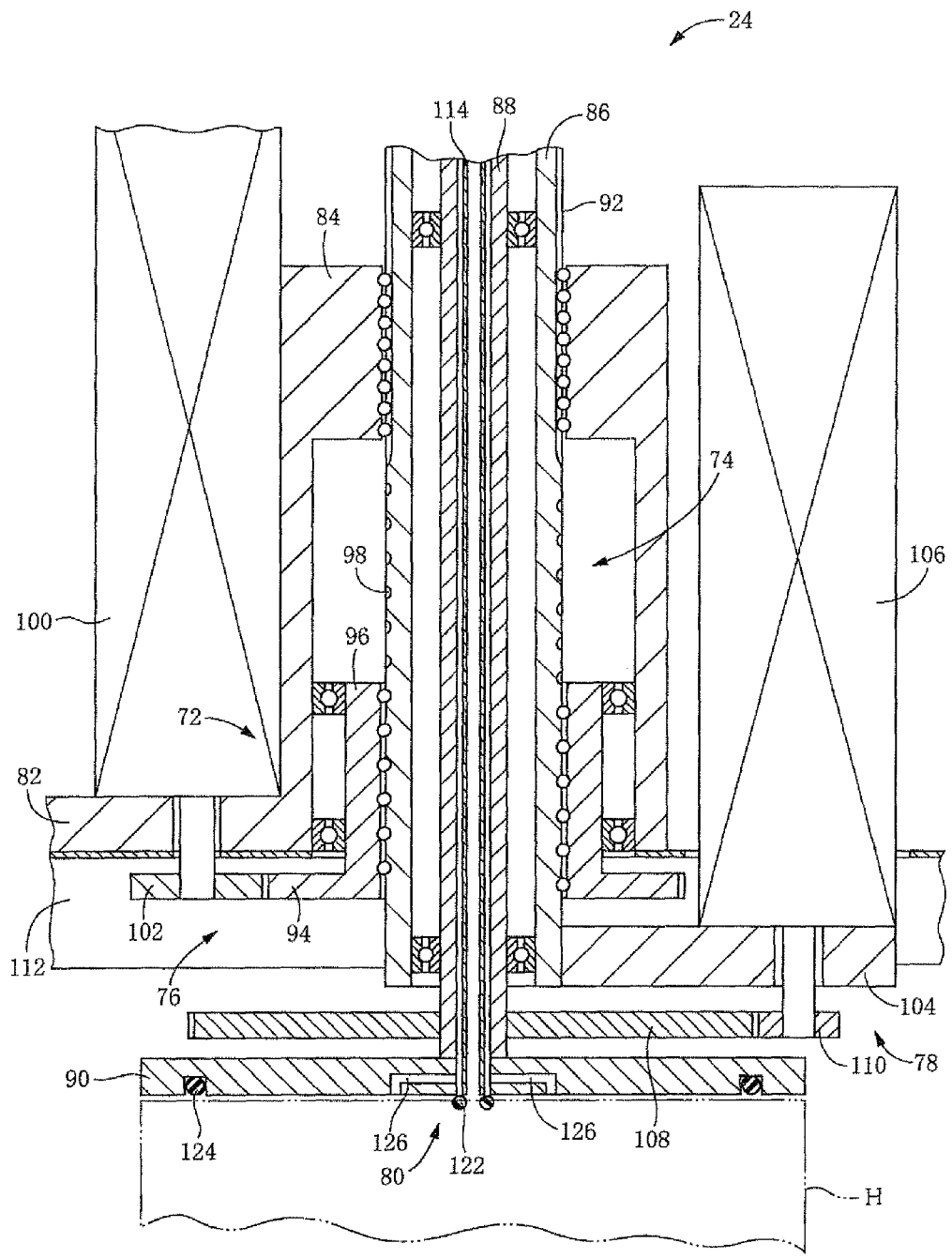
FIG. 5 is a cross-sectional view showing an internal structure of the head holding device.

The structure of the head holding device 24 will be explained referring also to the cross-sectional view of FIG. 5. The head holding device 24 has a base body constituted by a back plate 70 attached to the Y slide 44 and a base 72 projecting from the back plate 70 toward the front side. The head holding device 24 includes: a holding shaft 74 for holding, at its lower end portion, the head H; a head elevating and lowering mechanism 76 as a head moving mechanism for moving the head H up and down by moving the holding shaft 74 in the up-down direction (hereinafter referred to as "Z direction" where appropriate); a head rotating mechanism 78 for rotating the holding shaft 74 about an axis thereof and a head sucking device 80 for permitting the head H to be sucked to the holding shaft 74 by the negative pressure.

The base 72 has: a base plate portion 82 fixed to the back plate 70 and having a generally plate-like shape; and a holding sleeve portion 84 which holds the holding shaft 74. The holding shaft 74 is constituted by: a pipe-like outer tube 86; a pipe-like inner tube 88 which is rotatably supported by bearings in the outer tube 86 and whose lower end portion extends from the outer tube 86; and a disk-like holding plate 90 fixedly attached to the lower end portion of the inner tube 88. The head H is suction-held by the holding shaft 74 at the holding plate 90. That is, the lower surface of the holding plate 90 functions as a single holding portion of the head holding device 24. A spline groove 92 is formed at a portion of the outer tube 86 nearer to its upper end. The outer tube 86 is held by a ball-spline mechanism so as to be unrotatable and movable in the up-down direction (the Z direction), relative to the holding sleeve portion 84 of the base 72.

A rotation cylinder 96 having a flange portion 94 is rotatably held at an inner lower end portion of the holding sleeve portion 84. The holding shaft 74 penetrates the rotation cylinder 96. A screw groove 98 is formed on an outer circumferential surface of the outer tube 86 of the holding shaft 74. The rotation cylinder 96 functions as a bearing nut holding bearing balls. The outer tube 86 and the rotation cylinder 96 are held in engagement with each other through a ball screw mechanism. A head elevating and lowering motor 100 which is an electric motor is disposed on the base 72, and a gear 102 is attached to a motor shaft of the motor 100. On the outer circumference of the flange portion 94 of the rotation cylinder 96, there are formed gear teeth meshing with the gear 102. When the rotation cylinder 96 is rotated by the head elevating and lowering motor 100, the holding shaft 74 is elevated or lowered. That is, the head elevating and lowering motor 100, the gear 102, the rotation cylinder 96, the ball screw mechanism, etc., constitute the head elevating and lowering mechanism 76 for elevating and lowering the head H.

A support plate 104 is fixedly attached to a lower end portion of the holding shaft 74. A head rotation motor 106 which is an electric motor is supported by the support plate 104. A large gear 108 having a comparatively large diameter is fixedly fitted on the lower end portion of the inner tube 88 of the holding shaft 74, so as to be located above the holding plate 90. The large gear 108 is in mesh with a gear 110 which is attached to a motor shaft of the head rotation motor 106. The inner tube 88 and the holding plate 90 are rotated by rotation of the head rotation motor 106. That is, the head rotation motor 106, the large gear 108, the gear 110, etc., constitute the head rotating mechanism 78 for rotating the head H. In FIG. 4, the support plate 104, the large gear 108, etc., are hidden by a cover 112.

An air supply and discharge pipe 114 is disposed in the inner tube 88 of the holding shaft 74. An inside of the air supply and discharge pipe 114 functions as a passage (inside passage) through which the air with a positive or negative pressure passes and which is connected to a valve unit 116 provided at the upper portion of the holding shaft 74. The valve unit 116 includes a solenoid valve and is connected to a positive pressure source (not shown) via a positive-pressure connector 118 and to a negative pressure source (not shown) via a negative-pressure connector 120. By switching the solenoid valve, the positive-pressure air and the negative-pressure air are selectively supplied to the head H via the above-described inside passage in the air supply and discharge pipe 114. Here, "the negative-pressure air is supplied" means that the air is sucked. An inside of the inner tube 88 of the holding shaft 74 and an outside of the air supply and discharge pipe 114 that defines an annular space between the inner tube 88 of the holding shaft 74 and the air supply and discharge pipe 114 functions as a passage (outside passage) through which the negative-pressure sir passes. This passage is also connected to the valve unit 116. By activation of the solenoid valve, the negative-pressure air is supplied to the passage. As explained later, where the head H is configured to be operated by an action of at least one of the positive-pressure air and the negative-pressure air, a packing 122 is attached to the upper surface of the head H, thereby inhibiting communication of the air between the above-described inside and outside passages of the air supply and discharge pipe 114 when the head H is attached.

The head H is configured to be held by the holding shaft 74 by being sucked at its upper surface to the holding plate 90. A seal, ring 124 formed of rubber is attached to a lower surface of the holding plate 90. The negative pressure is supplied to a space defined by the seal ring 124 between the lower surface of the holding plate 90 and the upper surface of the head H, through the above-indicated outside passage of the air supply and discharge pipe 114, whereby the head H is sucked to the holding plate 90. That is, the outside passage of the air supply and discharge pipe 114, the valve unit 116, the seal ring 124, etc., constitute the head sucking device 80 configured to permit the head H to be sucked to the holding shaft 74. For allowing the negative pressure air to be supplied to the space described above even where one end of the outside passage described above is closed by the packing 122, there is formed, in the holding plate 90, a bypass passage 126 which branches off from the outside passage described above so as to be open to the lower surface of the holding plate 90.

As explained above, the head holding device 24 shown in FIG. 4 is holding the index-type nozzle head 60. The head holding device 24 is equipped with a nozzle selecting mechanism 130 for permitting one of the twelve suction nozzles 62 of the head 60 to selectively function, namely, the head holding device 24 is equipped with the nozzle selecting mechanism 130 as a mechanism for mounting only the component suction-held by the one suction nozzle 62 onto the substrate B. More specifically, the head holding device 24 includes a rotation ring 132 rotatably held by the base 72, a hook 134 fixed to the rotation ring 132 so as to extend downward therefrom, and a ring rotating motor 136 for rotating the rotation ring 132. The hook 134 has a width that permits only one of the twelve levers 64 to come into engagement therewith. The rotation ring 132 is rotated by rotation of the ring rotating motor 136 such that the hook 134 is located at a position of one of the twelve levers 64 that corresponds to one suction nozzle 62 to and from which the component is to be sucked and to be released. (This one suction nozzle 62 may be referred to as "target nozzle 62" where appropriate.) In this state, the head 60 is moved downward by the head elevating and lowering mechanism 76, whereby the above-indicated one lever 64 comes into engagement with the hook 134. When the head 60 is moved further downward, the target nozzle 62 can be moved downward by a distance larger than a distance of the downward movement of the head 60, by the action of the lever 64. That is, the head holding device 24 is equipped with the thus constructed nozzle selecting mechanism 130. While a detailed explanation is omitted, the head 60 is configured such that, by the action of the above-indicated one lever 64, the suction nozzle 62 corresponding to that one lever 64 is released from the negative pressure which has been supplied thereto, and only the component held by the target nozzle 62 selected by the nozzle selecting mechanism 130 is mounted onto the substrate B. An engaging surface of the hook 134 with which the lever 64 comes into engagement is formed as an inclined surface. At the time when the head 60 is moved downward to an arbitrary height position, the component is mounted by adjustment of the rotation position of the rotation ring 132.

<Heads to be held by Head Holding Device>

Figure 6A:
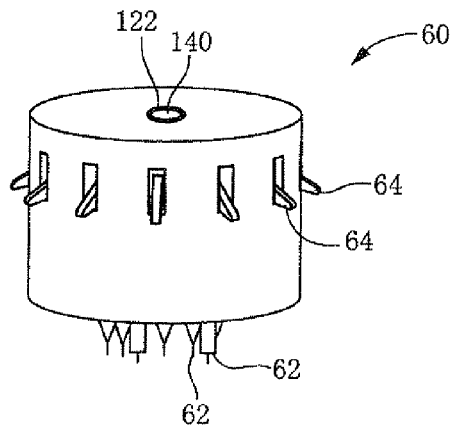
FIGS. 6A-6C are perspective views showing work heads each of which is holdable by the head holding device.
Figure 6B:
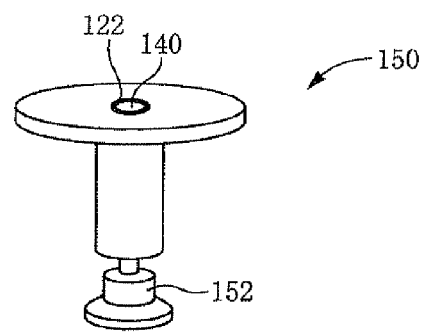
Figure 6C:
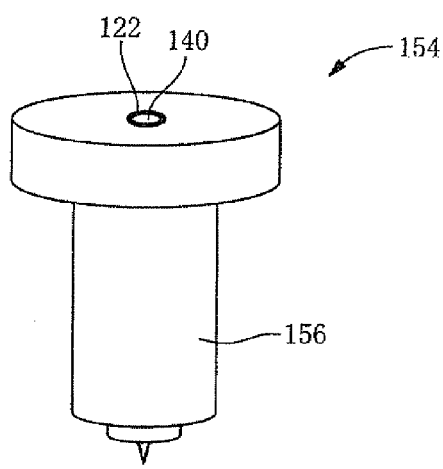

FIGS. 6A-6C show some heads H which are attachable to the component mounting apparatus 10. Each of the heads H shown in FIGS. 6A-6C is a work head configured to carry out a main operation to be performed by the component mounting apparatus 10. The head H shown in FIG. 6A is one sort of the component holding head and is the index-type nozzle head 60 explained above. The head 60 is configured to suction-hold the components onto the respective twelve suction nozzles 62 by supplying the negative pressure and to sequentially release the components one by one by stopping the supply of the negative pressure, so that the components can be mounted on the surface of the substrate B. The supply of the negative pressure to the suction nozzles 62 is conducted through an air supply port 140 formed at the center of the upper surface of the head 60 which functions as a surface at which the head 60 is to be held by the holding plate 90. The above-indicated packing 122 is provided on the upper surface so as to surround the air supply port 140. Because the function of the lever 64 has been explained above, no more explanation is made here.

The head H shown in FIG. 6B is a single-type nozzle head 150 as one sort of the component holding head. The head 150 has a single suction nozzle 152 and is configured to suction-hold only one relatively large-size component. As in the index-type nozzle head 60 described above, the port 140 is formed in the upper surface of the head 150 for supplying the negative pressure to the suction nozzle 152. Further, the packing 122 is also provided.

The head H shown in FIG. 6C is not the component holding head, but a dispenser head 154 configured to apply, prior to mounting of the component, an adhesive to a location on the substrate B at which the component is to be mounted. The head 154 has a syringe 156 in which the adhesive is stored. The adhesive is ejected from the tip of the syringe 156 by an action of the positive-pressure air supplied to the head 154. As in the heads 60, 150, the positive-pressure air is supplied through the port 140 formed in the upper surface of the head 154.

In the present component mounting apparatus 10, detection heads shown in FIGS. 7A-7D are attachable, other than the work heads shown in FIG. 6. The detection heads include an image taking head configured to take an image of the substrate fiducial mark provided on the surface of the substrate B, an image of a portion of the surface of the substrate B at which the adhesive is to be applied or the component is to be mounted, prior to component mounting or adhesive application, or configured to take an image of the component mounted on the surface of the substrate B. Further, the detection heads include a sensing head configured to detect a position (height) of the substrate B or the mounted component, in the Z direction.

More specifically, the head H shown in FIG. 7A is an image taking head equipped with a camera whose field of view is comparatively narrow, and may be referred to as a narrow-field-of-view image taking head 160. The camera of the image taking head 160 is a narrow-field-of-view camera 162 which is a unifocal, monochrome CCD camera. The image taking head 160 has a ring strobe 164 as a light source. From the strobe 164, there is emitted generally red light in the downward direction. The image taking head 160 is configured to mainly take an image of the substrate fiducial mark.

The image taking head 160 incorporates a battery 166 as a power source for activating the camera 162 and the strobe 164. Further, a power receiver 168 is also incorporated for attaining noncontact power supply utilizing the principle of electromagnetic induction or the like. The battery 166 is charged through the power receiver 168. The image taking head 160 further incorporates a control circuit 170 for controlling operations of the camera 162 and the strobe 164. The control by the control circuit 170 is executed under a control of the controller 54 which controls the component mounting apparatus 10 as a whole. Data of images taken by the camera 162 is processed by the controller 54. Accordingly, the head 160 includes a transmitter-receiver 172 and an antenna 174 for attaining wireless transmission and reception between the controller 54 and the control circuit 170.

The head H shown in FIG. 7B is an image taking head equipped with a camera whose field of view is comparatively wide, and may be referred to as a wide-field-of-view image taking head 180. The camera of the image taking head 180 is a wide-field-of-view camera 182 which is a unifocal, color CCD camera. Like the narrow-field-of-view image taking head 160, the image taking head 180 has a ring strobe 184 as a light source. From the strobe 184, there is emitted white light in the downward direction. The camera 182 of the image taking head 180 has a higher degree of resolution than the narrow-field-of-view camera 162 described above, namely, the pixel density of the CCD is made high. The image taking head 180 is configured to mainly take an image of a portion of the surface of the substrate B on which is to be mounted the component that requires high mounting accuracy or an image of the component after having been mounted on the substrate B. Like the narrow-field-of-view image taking head 160, the image taking head 180 incorporates the battery 166, the power receiver 168, the control circuit 170, and the transmitter-receiver 172, and includes the antenna 174.

The head H shown in FIG. 7C is an image taking head which is different from the above-indicated two image taking heads 160, 180 in camera angle, and may be referred to as a different-angle image taking head 190. The camera of the image taking head 190 is an angle camera 192 whose optical axis is refracted perpendicularly and which is capable of taking an image in the horizontal direction. The image taking head 190 is not equipped with a light source. Like the above-indicated two image taking heads 160, 180, the head 190 incorporates the control circuit 170 for controlling the operation of the camera 192 and the transmitter-receiver 172, and includes the antenna 174. However, unlike the above-indicated two image taking heads 160, 180, the head 190 is not equipped with the battery and the power receiver. In the image taking head 190, the power is supplied to the camera 192 and the control circuit 170 through power receiving terminals 194 each provided on the upper surface of the head 190 and functioning as a connector. While not shown, a power-source supply line is wired in the head holding device 24, and the power-source supply line is connected to power transmitting terminals provided on the lower surface of the holding plate 90 of the holding shaft 74. In a state in which the image taking head 190 is held by the head holding device 24, the power transmitting terminals and the power receiving terminals 194 contact each other, enabling the power supply.

The head H shown in FIG. 7D is not a head for taking an image of an object, but is a detection head for detecting a height (level) of the object, and may be referred to as a height detection head 200. The head 200 includes: a beam emitting portion 202 for emitting, obliquely and downwardly, a beam to the object; and a beam-incident-point taking portion 204 for taking an image of a beam-incident point on the surface of the object. While a detailed explanation is not given, where the head 200 is used, it is possible to detect, on the basis of a position of a beam-incident point in the image taken by the image taking portion 204, a distance between the beam-incident point and the image taking head, namely, a height position (level) of the upper surface of the object. Like the narrowfield-of-view image taking head 160 and the wide-field-of-view image taking head 180, the image taking head 200 incorporates the battery 166, the power receiver 168, the control circuit 170, and the transmitter-receiver 172, and includes the antenna 174.

One of the above-indicated work heads and detection heads is selectively held by the head holding device 24, and a plurality of heads H are sequentially replaced with one another in one mounting operation. In the present component mounting apparatus 10, the three heads, i.e., the single-type nozzle head 150, the index-type nozzle head 60, and the dispenser head 154, each as the work head, and the three heads, i.e., the narrow-field-of-view image taking head 160, the wide-field-of-view image taking head 180, and the height detection head 200, each as the detection head, are accommodated in the head stocker 52 described above.

Figure 8:
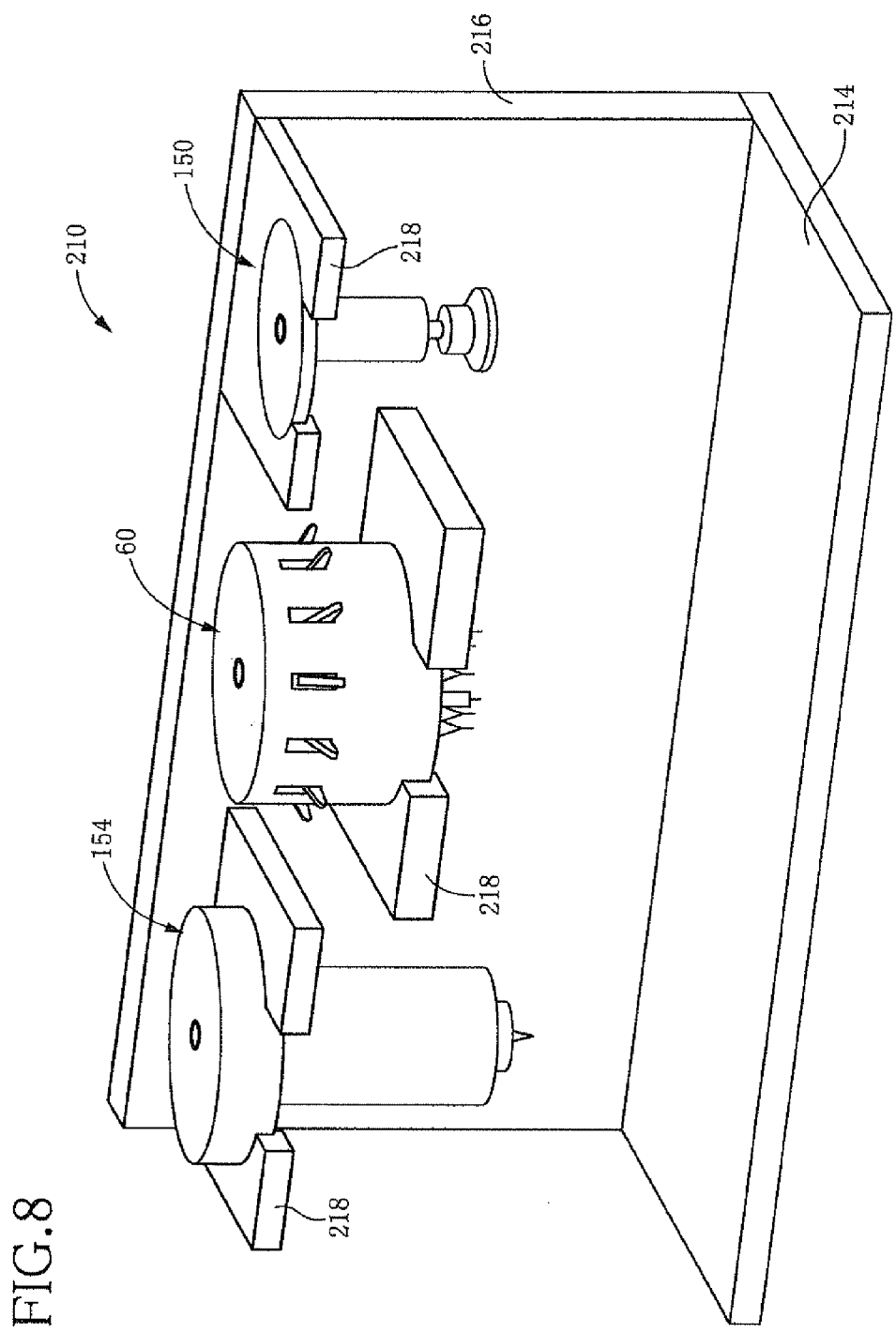
FIG. 8 is a perspective view showing a state in which the work heads are disposed in a head stocker of the component mounting apparatus.

As shown in FIG. 1, the head stocker 52 is constituted by two stock portions, namely, a first stock portion 210 and a second stock portion 212. In the first stock portion 210, the above-indicated three work heads, i.e., the single-type nozzle head 150, the index-type nozzle head 60, and the dispenser head 154, are disposed in this order from the right side in FIG. 8. The first stock portion 210 is constituted by a base plate 214, a back plate 216 extending upright from the base plate 214, and three table plates 218 fixed to the back plate 216 so as to extend therefrom frontward. Each of the three table plates 218 is formed with a stepped cutout whose periphery is stepped and which has a generally circular shape. Each of the heads H is accommodated in a corresponding one of the cutouts such that the head H is placed on the periphery of the stepped cutout. That is, the three heads H are disposed at the respective positions set for the respective heads H. The heights of the respective three table plates 218 are adjusted such that the height positions of the upper surfaces of the respective three heads 150, 60, 154 are equal to each other.

Figure 9:
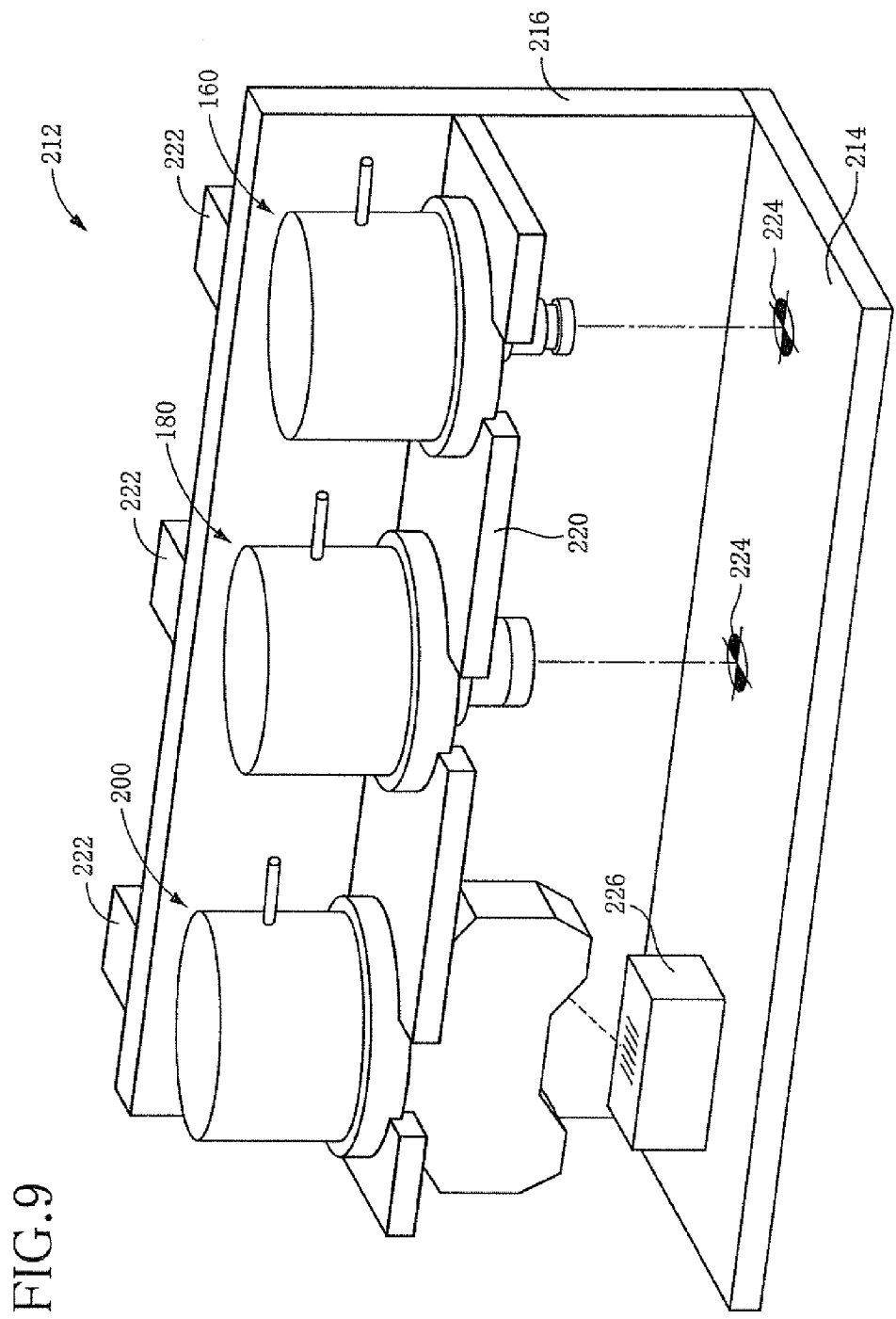
FIG. 9 is a perspective view showing a state in which the detection heads are disposed in the head stocker of the component mounting apparatus.

As shown in FIG. 9, in the second stock portion 212, the above-indicated three detection heads, i.e., the narrow-field-of-view image taking head 160, the wide-field-of-view image taking head 180, and the height detection head 200, are disposed in this order from the right side in FIG. 9. The second stock portion 212 is constituted by the base plate 214, the back plate 216, and a table plate 220 fixed to the back plate 216 so as to extend therefrom frontward. The table plate 220 is formed with three stepped cutouts. The periphery of each cutout is stepped, and each cutout has a generally circular shape. Each of the three heads H is accommodated in a corresponding one of the cutouts such that the head H is placed on the periphery of the stepped cutout. That is, the three heads H are disposed at respective positions set for the respective heads H. In a state in which the three heads H are accommodated, the three heads H are disposed such that the heights of the upper surfaces of the respective three heads H are equal to each other.

The second stock portion 212 has three power suppliers 222 fixed to the backside of the back plate 216. Each of the three power suppliers 222 is for attaining noncontact power supply with respect to a corresponding one of the heads H. The battery 166 of each head H is charged through the power receiver 168 of the head H in a state in which the head H is disposed in the second stock portion 212.

On the upper surface of the base plate 214 of the second stock portion 212, there are provided fiducial marks 224 at respective positions which fall within respective fields of view of the narrow-field-of-view camera 162 and the wide-field-of-view camera 182 in a state in which the narrow-field-of-view image taking head 160 and the wide-field-of-view image taking head 180 are disposed in the second stock portion 212. At the time when each of the two heads 160, 180 is held by the head holding device 24, an image of each of the fiducial marks 224 is taken by the camera 162, 182 of the corresponding head 160, 180. On the basis of data obtained by the image taking operation, the controller 54 obtains a position shift of the optical axis of each camera 162, 182 relative to the head holding device 24. More specifically, it is possible to detect the position shift relative to the axis of the holding shaft 74 of the head holding device 24 in a direction perpendicular to the axis. On the upper surface of the base plate 214, there is further provided a fiducial block 226 below the position at which the height detection head 200 is disposed. At the time when the head holding device 24 holds the height detection head 200, the beam emitting portion 202 emits a beam to the upper surface of the fiducial block 226, and the beam-incident-point image taking portion 204 takes an image of an incident point of the beam (beam incident point) on the upper surface of the block 226. The controller 54 is configured to obtain a position shift, in a height direction, of the height detection head 200 relative to the head holding device 24, namely, a shift of a reference height position of the height detection head 200. Thus, in the present component mounting apparatus, the shift of the optical axis of each camera and the shift of the reference height position of a height sensor can be obtained at the time when the head holding device 24 holds each head H and at the position where the head holding device 24 holds each head H. Accordingly, it is possible to promptly perform calibration relating to the detection head H.

When one of the heads H disposed in the head stocker 52 is attached to the head holding device 24, the head holding device 24 is initially moved by the moving device 26 right above the one head H, namely, to a position set for the one head H with respect to the head stocker 52. More specifically, the head holding device 24 is moved to a position at which the axis of the holding shaft 74 coincides with the center axis of the one head H. In this state, the holding shaft 74 is moved downward by the head elevating and lowering mechanism 76 to a height position at which the lower surface of the holding plate 90 comes into contact with the upper surface of the one head H. Subsequently, the negative pressure is supplied between the lower surface of the holding plate 90 and the upper surface of the one head H as explained above, whereby the one head H is held by the head holding device 24. On the contrary, when the one head H attached to the head holding device 24 is detached therefrom, the head holding device 24 is initially moved to a position right above the cutout of the corresponding table plate 218, 220 in which the one head H is to be disposed. In this state, the holding shaft 74 is moved downward by the head elevating and lowering mechanism 76 to a height position at which the one head H is placed on the corresponding table plate 218, 220. Subsequently, the negative pressure which has been supplied between the lower surface of the holding plate 90 and the upper surface of the one head H is stopped to be supplied, whereby the one head H is removed or detached from the head holding device 24. Where the one head H held by the head holding device 24 is replaced with another head H, the detachment and the attachment of the heads H described above may be sequentially conducted.

<Flow of Operation by Component Mounting Apparatus>

Figure 10:
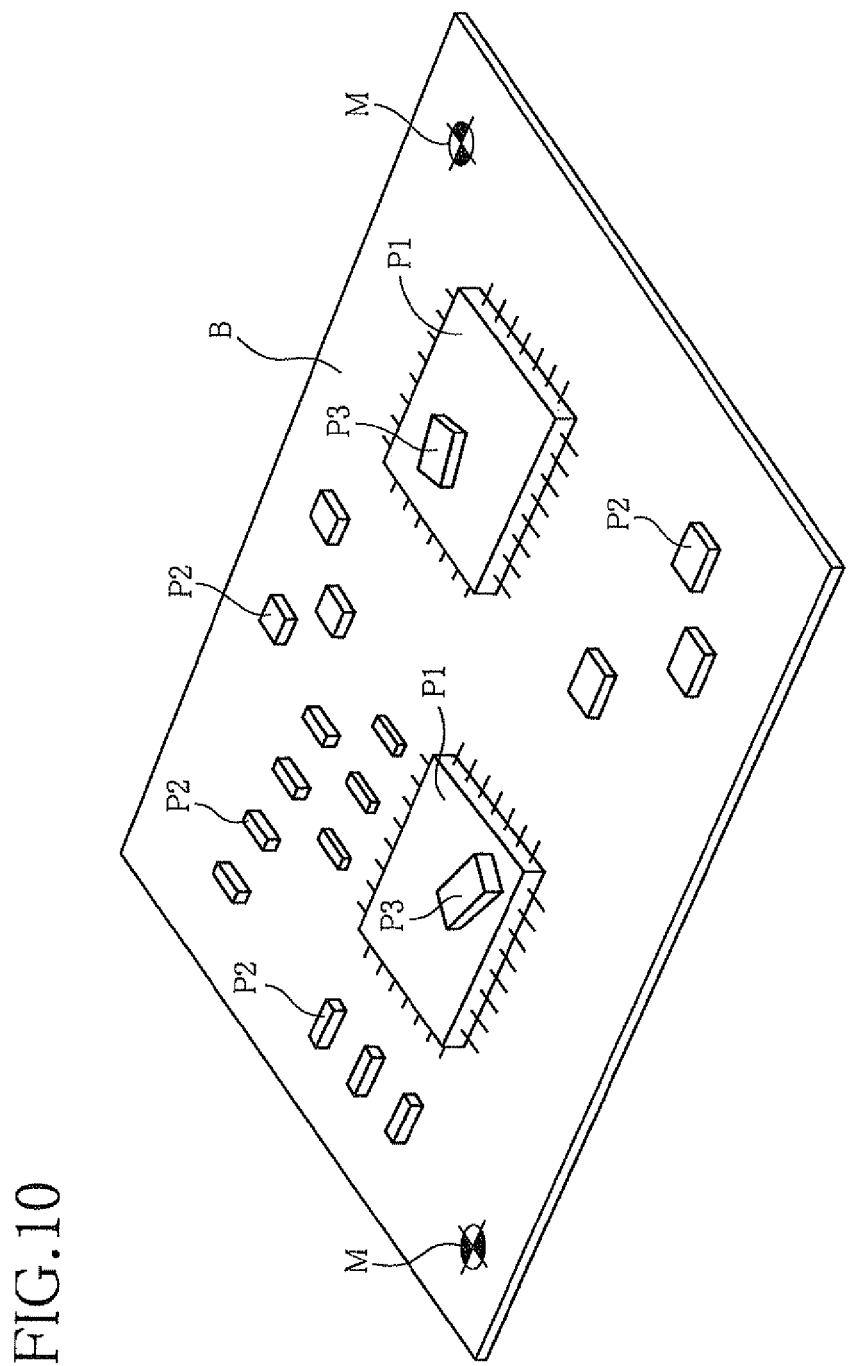
FIG. 10 is a view schematically showing an electric circuit fabricated by the component mounting apparatus.

Hereinafter, there will be explained a flow of the operation by the component mounting apparatus 10, by taking, for example, component mounting for fabrication of an electric circuit schematically shown in FIG. 10. For fabricating the electric circuit, two large-size components P1 and some small-size components P2 are mounted on the substrate B, and a stack component P3 is stacked on each of the two large-size components P1. On the substrate B, two substrate fiducial marks M are provided at respective diagonal positions of the substrate B. The operation is divided into some steps, and the head H to be attached to the head holding device 24 differs depending upon the steps. The table of FIG. 11 shows the respective steps and the manner of exchanging the heads H conducted prior to each step. The following explanation will be made based on the table of FIG. 11. Since the mounting operation of the components are ordinary one, its detailed explanation is dispensed with.

Figure 12:
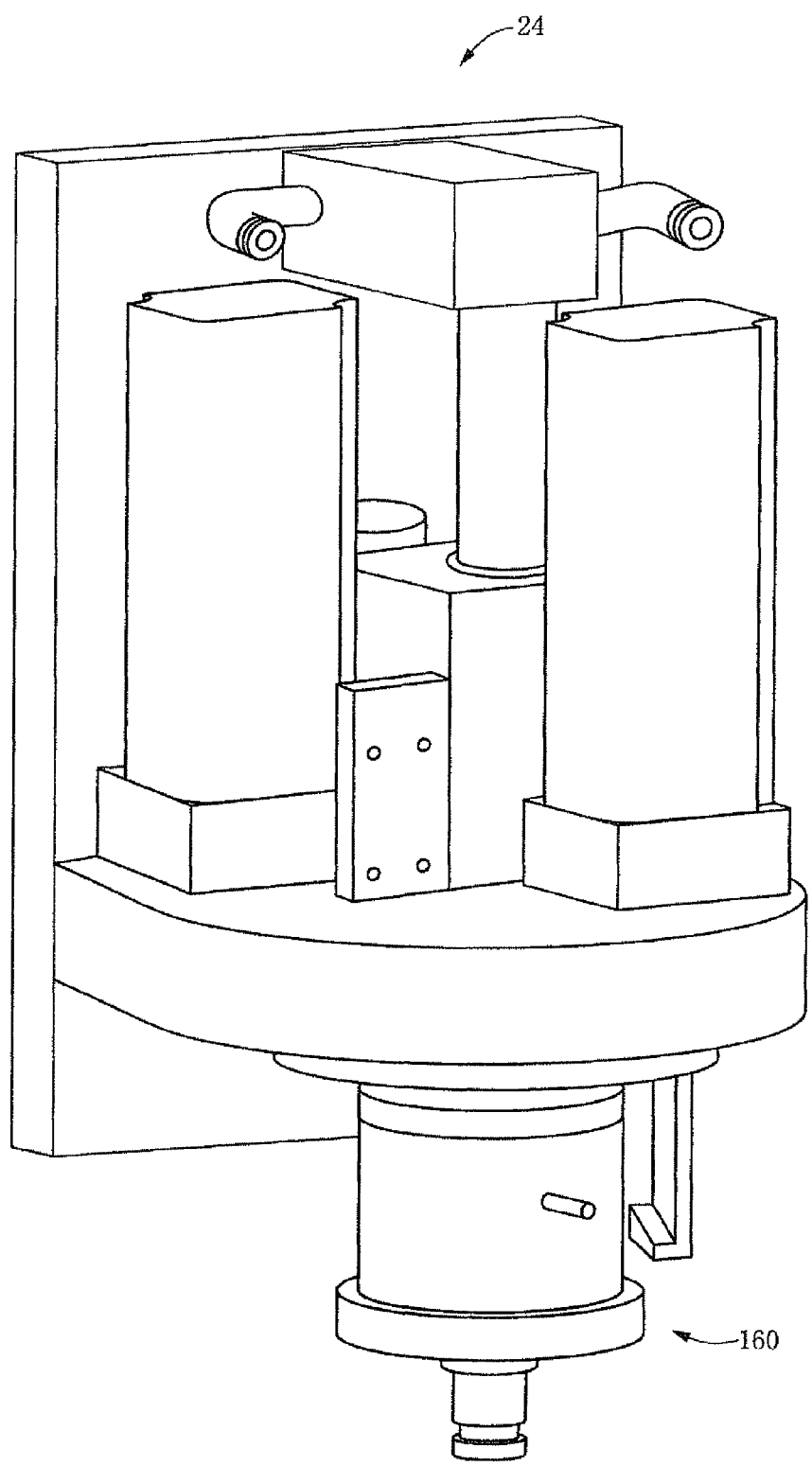
FIG. 12 is a perspective view showing the head holding device in a state in which the head holding device holds an image taking head as one kind of the detection head.

In the first step, i.e., step 1 (hereinafter abbreviated as "S1" and other steps are similarly abbreviated), the substrate B is conveyed by the substrate conveying and fixing device 20 from an upstream-side circuit-substrate-related-operation performing apparatus, and the substrate B is fixed at a predetermined position. In parallel with this step, the head holding device 24 is moved by the moving device 26 above the head stocker 52, and the narrow-field-of-view image taking head 160 is attached to the head holding device 24. FIG. 12 shows a state in which the head holding device 24 holds the narrow-field-of-view image taking head 160.

In S2, the head holding device 24 is moved such that the narrow-field-of-view image taking head 160 held by the head holding device 24 is located at a position above each of the substrate fiducial marks M provided on the substrate B which is fixed at the predetermined position. Subsequently, an image of each substrate fiducial mark M is taken. On the basis of data of the taken images, the controller 54 obtains a shift of the fixed position of the substrate and a shift of the posture of the substrate. In the subsequent steps, the operation is performed while taking the shifts into consideration.

Next, the narrow-field-of-view image taking head 160 is exchanged with the wide-field-of-view image taking head 180. In S3, the wide-field-of-view image taking head 180 takes an image of a portion of the surface of the substrate B at which each large-size component P1 is to be mounted. As apparent from FIG. 10, the large-size component P1 has a number of leads, and each of the leads needs to be placed on a corresponding one of lands on the substrate B with high accuracy. Accordingly, a high degree of mounting accuracy is required. To this end, the image of the above-indicated portion of the surface of the substrate B is taken by the head 180, whereby the position of each land can be accurately grasped on the basis of data of the taken image.

Then, the wide-field-of-view image taking head 180 is exchanged with the dispenser head 154. As the large-size component P1 is mounted on the substrate B using an adhesive, the adhesive is applied by the dispenser head 154 in S4 to the portion of the substrate B on which the large-size component P1 is to be mounted.

Subsequently, the dispenser head 154 is exchanged with the single-type nozzle head 150. Because the single-type nozzle head 150 is suitable for holding a component with a large size, the single-type nozzle head 150 is used in mounting the large-size component P1 in S5. More specifically, the large-size component P1 supplied from the component supplier 22 is held by the head 150. In this state, the component camera 50 takes an image of the large-size component P1 from below. On the basis of data of the taken image, the controller 54 obtains shifts of the position and the posture of the large-size component P1 held by the head 150. On the basis of the thus obtained shifts and the positions of the lands already grasped, the large-size component P1 is mounted on the substrate B via the adhesive. Since the two large-size components P1 are mounted on the substrate B, the mounting operation is performed twice in S5.

Then, the single-type nozzle head 150 is exchanged with the height detection head 200. As the stack components P3 axe to be stacked on the respective two large-size components P1, the height position of the upper surface of each large-size component P1 which has been already mounted on the substrate B is detected by the height detection head 200.

Thereafter, the height detection head 200 is exchanged again with the dispenser head 154. The stack components P3 are mounted on the respective large-size components P1 also via the adhesive. Accordingly, in S7, the adhesive is applied by the dispenser head 154 to a portion of the upper surface of each large-size component P1 on which the stack component P3 is mounted.

Subsequently, the dispenser head 154 is exchanged with the index-type nozzle head 60. In S8, each small-size component P2 is mounted on the surface of the substrate B by the head 60. More specifically, a plurality of small-size components P2 supplied from the component supplier 22 are held by the head 60. In this state, the component camera 50 takes an image of the small-size components P2 at a time from below. On the basis of data of the taken image, the controller 54 obtains shifts of the position and the posture of each small-size component P2 held by the head 60. Each of the small-size components P2 is mounted while taking the thus obtained shifts into consideration. In this respect, each small-size component P2 is mounted via cream solder which has been already printed on the surface of the substrate B. In S9, each stack component P3 is mounted on the surface of the substrate B by the head 60. More specifically, the two stack components P3 supplied from the component supplier 22 are held by the head 60. In this state, the component camera 50 takes an image of the two stack components P3 at a time from below. On the basis of data of the taken image, the controller 54 obtains shifts of the position and the posture of each stack component P3 held by the head 60. On the basis of the thus obtained shifts and the already detected height of the upper surface of each large-size components P1, each stack component P3 is mounted on the upper surface of the corresponding large-size component P1 via the adhesive.

Then the index-type nozzle head 60 is exchanged with the wide-field-of-view image taking head 180. It is preferable that the mount positions of some of the components P1, P2, P3 (hereinafter simply referred to as "the components P" where appropriate) be particularly accurate. In the light of this, in S10, the wide-field-of-view image taking head 180 takes an image of each of some components P. On the basis of data of the taken image, the controller 54 makes an inspection of the mount position of each of some components P. Concretely, it is confirmed whether or not the shift of the position and the shift of the posture of each of some components P fall within respective permissible ranges, whether or not each of some components P suffers from component standing phenomenon, etc.

After S10, the wide-field-of-view image taking head 180 held by the head holding device 24 is detached therefrom. In parallel with the detachment of the head 180, the substrate B on which the components P have been mounted is freed from the fixation by the substrate conveying and fixing device 20 in S11, and the substrate B is conveyed out of the component mounting apparatus 10.

The mounting operation described above is one example, and the present component mounting apparatus 10 is capable of simply performing a mounting operation composed of various sorts of element operations by conducting the operation while exchanging the heads among various sorts of work heads and various sorts of detection heads. In other words, the present component mounting apparatus 10 is formed as a highly versatile circuit-substrate-related-operation performing apparatus.

MODIFIED EMBODIMENTS

The component mounting apparatus 10 according to the illustrated embodiment is configured such that any one of the three heads, i.e., the narrow-field-of-view image taking head 160, the wide-field-of-view image taking head 180, and the height detection head 200, is attachable as the detection head H. In place of any of the three detection heads H or in addition to the three detection heads H, the different-angle image taking head 190 described above may be attachable.

Figure 13:
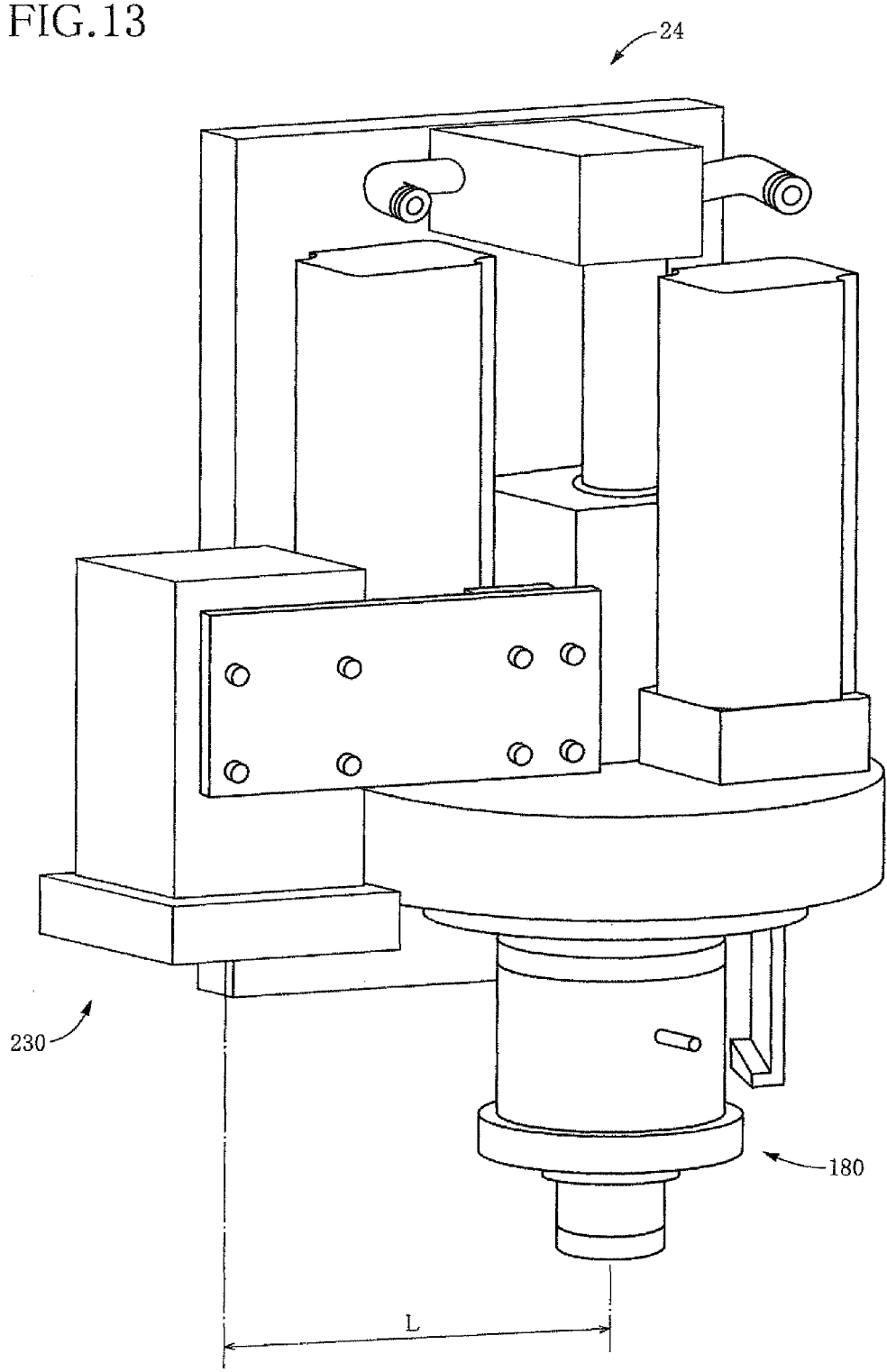
FIG. 13 is a perspective view showing the head holding device to which is fixed an image taking device, apart from the image taking head.

In the component mounting apparatus 10 according to the illustrated embodiment, there is not provided an image taking device which is fixedly provided on the head holding device 24. Such an image taking device may be provided. FIG. 13 shows a state in which an image taking device 230 principally constituted by a camera is fixed to the head holding device 24 via a bracket, apart from the image taking head H. The image taking device 230 has a function similar to that of the narrow-field-of-view image taking head 160 explained above. That is, the image taking device 230 has a unifocal camera with a resolution, a field of view, and an image taking direction which are similar to those of the narrow-field-of-view camera 162 explained above and has a light source similar to that of the narrow-field-of-view image taking head 160. In FIG. 13, the wide-field-of-view image taking head 180 is exchangeably attached to the head holding device 24. In the circuit-substrate-related-operation performing apparatus which includes the stationary image taking device 230 and the exchangeably attached image taking heads H, although the axis of the head holding device 24 (the axis of the holding shaft 74) and the optical axis of the image taking device 230 are shifted from each other, the number of times of exchanging of the image taking heads H can be reduced, accelerating the operation.

Where the axis of the head holding device 24 and the optical axis of the image taking device 230 are shifted from each other as described above, it is required to move the head holding device 24 by an additional distance corresponding to an amount of the shift (shift amount L) as in the conventional circuit-substrate-related-operation performing apparatus when the image taking device 230 is moved in the same area as the work area of the head H. In other words, the size of the moving device 26 increases by an amount corresponding to the shift amount L, and the moving range of the head holding device 24 needs to be increased by an amount twice the shift amount L. In view of this, the apparatus is preferably configured such that the detection head H having a function similar to that of the image taking device 230 is attachable, instead of providing the image taking device 230 described above.

What is claimed is:

1. A circuit-substrate-related-operation performing apparatus for performing a circuit-substrate-related operation which is an operation on a circuit substrate, comprising:
   a plurality of heads, including:
      at least one work head that includes a component holding head for holding a component to be mounted on the circuit substrate; and
      at least one detection head that includes at least one image taking head, the at least one image taking head including a camera as one principal constituent element;
   a head holding device configured to hold, at a holding portion thereof, one of the plurality of heads, the head holding device including:
      a head moving mechanism configured to move, in a direction perpendicular to the circuit substrate, the one of the plurality of heads held by the head holding device; and
      a head rotating mechanism configured to rotate, about an axis perpendicular to the circuit substrate, the one of the plurality of heads held by the head holding device;
   a moving device configured to move the head holding device in a direction along a straight line parallel to the circuit substrate or to move the head holding device along one flat plane parallel to the circuit substrate;
   a head stock device in which the plurality of heads are stocked; and
   a controller configured to control the circuit-substrate-related-operation performing apparatus, wherein
      the controller includes a head attachment control portion configured to control the moving device and the head holding device such that the head holding device is moved to a set position which is set with respect to the head stock device and such that an arbitrary one of the plurality of heads is held by the head holding device.

2. The circuit-substrate-related-operation performing apparatus according to claim 1, wherein the at least one detection head includes, as the at least one image taking head, a plurality of image taking heads.

3. The circuit-substrate-related-operation performing apparatus according to claim 2, wherein the cameras of the respective image taking heads are mutually different in any of resolution, field of view, and image taking direction.

4. The circuit-substrate-related-operation performing apparatus according to claim 2, wherein the plurality of image taking heads have respective light sources which are mutually different in wavelength distribution of light to be emitted.

5. The circuit-substrate-related-operation performing apparatus according to claim 1, further comprising a fiducial mark which is provided for one of the at least one image taking head at a position which is within a field of view of the camera of the one of the at least one image taking head, in a state in which the one of the at least one image taking head is stocked in the head stock device, the fiducial mark being for obtaining a position shift of an optical axis of the camera relative to the head holding device.

6. The circuit-substrate-related-operation performing apparatus according to claim 1, wherein the at least one detection head comprises a detection head which has a transmitter capable of transmitting detection data obtained by itself.

7. The circuit-substrate-related-operation performing apparatus according to claim 1, wherein the at least one detection head comprises a detection head configured to receive, from the head holding device, an electric power by which the detection head is operated, in a state in which the detection head is held by the head holding device.

8. The circuit-substrate-related-operation performing apparatus according to claim 1, wherein the at least one detection head comprises a detection head having a battery by which the detection head is operated, and the battery is charged in a state in which the detection head is stocked by the head stock device.

9. The circuit-substrate-related-operation performing apparatus according to claim 1, further comprising, apart from the at least one detection head, an image taking device which is provided on the head holding device and which is capable of taking an image of a surface of the circuit substrate.

10. The circuit-substrate-related-operation performing apparatus according to claim 9, wherein the image taking device includes a fixed-focus camera.

* * * * *